US006769098B2

(12) United States Patent
Tanaka et al.

(10) Patent No.: US 6,769,098 B2
(45) Date of Patent: Jul. 27, 2004

(54) METHOD OF PHYSICAL DESIGN FOR INTEGRATED CIRCUIT

(75) Inventors: Masakazu Tanaka, Kyoto (JP); Masahiro Fukui, Osaka (JP); Shuji Tsukiyama, Tokyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/793,564

(22) Filed: Feb. 27, 2001

(65) Prior Publication Data

US 2001/0018758 A1 Aug. 30, 2001

(30) Foreign Application Priority Data

Feb. 29, 2000 (JP) .................................... 2000-053045

(51) Int. Cl.[7] ............................................. G06F 17/50
(52) U.S. Cl. .................... 716/2; 716/4; 716/5; 716/6
(58) Field of Search ..................................... 716/1–19

(56) References Cited

U.S. PATENT DOCUMENTS

| 3,970,866 | A | * | 7/1976 | Fulkerson ................... 326/125 |
| 5,159,682 | A | * | 10/1992 | Toyonaga et al. ............ 716/10 |
| 5,212,653 | A | * | 5/1993 | Tanaka ......................... 716/8 |
| 5,666,288 | A | | 9/1997 | Jones et al. |
| 5,737,236 | A | * | 4/1998 | Maziasz et al. ............... 716/8 |
| 5,764,531 | A | * | 6/1998 | Kojima et al. ................ 716/6 |
| 5,764,532 | A | * | 6/1998 | Patel ............................. 716/6 |
| 5,995,734 | A | | 11/1999 | Saika |
| 6,393,601 | B1 | * | 5/2002 | Tanaka et al. ................ 716/2 |
| 6,415,417 | B1 | * | 7/2002 | Tanaka et al. ................ 716/2 |

FOREIGN PATENT DOCUMENTS

| JP | 9-298243 | 11/1997 |
| JP | 10-173053 | 6/1998 |
| JP | 10-256375 | 9/1998 |
| JP | 11-3973 | 1/1999 |
| JP | 11-003973 | 1/1999 |
| JP | 11-213029 | 8/1999 |

OTHER PUBLICATIONS

Naoshi Sugiyama, "Practical Asic Technique", pp. 2–3, Apr. 24,1987, Kogyo Chosakai Publishing Co., Ltd.

* cited by examiner

*Primary Examiner*—Matthew Smith
*Assistant Examiner*—Sun James Lin
(74) *Attorney, Agent, or Firm*—McDermott Will & Emery LLP

(57) ABSTRACT

A physical design method optimizes the performance of an integrated circuit much more efficiently. After an initial layout is obtained for an integrated circuit, a set of process steps, including evaluating the overall performance of the integrated circuit, selecting a candidate cell and changing the performance of the cell, is carried out a number of times. In the step of selecting a candidate cell, a cell, which should have its performance changed, is selected from multiple cells included in the integrated circuit based on the performance evaluation result obtained. Then, by reference to a library, a characteristic representing the performance of the candidate cell is determined in accordance with an external condition imposed thereon.

23 Claims, 8 Drawing Sheets

| No. | type of logic function | type of performance |
|---|---|---|
| 1 | inverter | — |
| 2 | two-input AND gate | — |
| 3 | three-input AND gate | — |
| 4 | two-input NAND gate | — |
| ⋮ | ⋮ | |
| ⋮ | ⋮ | |
| | | |

FIG. 3B

| | external condition | | performance characteristic | | | | |
|---|---|---|---|---|---|---|---|
| No. | input drive | output load capacitance | area | delay | power dissipation | output drive | input load capacitance |
| 1 | 10kΩ | 0.1pF | 0.1 μm² | 0.1ns | 10 μW | 30kΩ | 0.01pF |
| | | | 0.2 μm² | 0.08ns | 20 μW | 20kΩ | 0.02pF |
| | | | 0.3 μm² | 0.07ns | 30 μW | 20kΩ | 0.02pF |
| | | | 0.3 μm² | 0.08ns | 25 μW | 20kΩ | 0.02pF |
| | | | ⋮ | ⋮ | ⋮ | ⋮ | ⋮ |
| | | | | | | | |
| 2 | 20kΩ | 0.1pF | 0.08 μm² | 0.12ns | 9 μW | 30kΩ | 0.01pF |
| | | | 0.18 μm² | 0.09ns | 18 μW | 20kΩ | 0.015pF |
| | | | 0.27 μm² | 0.08ns | 28 μW | 20kΩ | 0.015pF |
| | | | 0.27 μm² | 0.09ns | 24 μW | 20kΩ | 0.015pF |
| | | | ⋮ | ⋮ | ⋮ | ⋮ | ⋮ |
| | | | | | | | |
| 3 | 20kΩ | 0.2pF | 0.15 μm² | 0.2ns | 15 μW | 40kΩ | 0.01pF |
| ⋮ | | | ⋮ | ⋮ | ⋮ | ⋮ | ⋮ |
| ⋮ | | | | | | | |
| | | | | | | | |

FIG. 5A

| No. | type of logic function | type of performance |
|---|---|---|
| 1 | inverter | A |
| 2 | | B |
| 3 | | C |
| 4 | | D |
| 5 | two-input AND gate | A |
| 6 | | B |
| 7 | | C |
| 8 | | D |
| 9 | three-input AND gate | A |
| 10 | | B |
| 11 | | C |
| 12 | two-input NAND gate | A |
| 13 | | B |
| 14 | | C |
| 15 | | D |
| ⋮ | ⋮ | ⋮ |

FIG. 5B

| external condition | performance characteristic | | | | |
|---|---|---|---|---|---|
| output load capacitance | area | delay | power dissipation | output drive | input load capacitance |
| 0.1pF | 0.1 μm² | 0.1ns | 10 μW | 30KΩ | 0.01pF |
| 0.2pF | | 0.2ns | 15 μW | | |
| ⋮ | | ⋮ | ⋮ | | |

…

METHOD OF PHYSICAL DESIGN FOR INTEGRATED CIRCUIT

BACKGROUND OF THE INVENTION

The present invention relates to physical design technology for an integrated circuit like CMOS or LSI.

In a known design process, a library of cells, causing delays of various lengths or having mutually different areas, is prepared for a circuit being designed to optimize the performance setting parameters of the circuit such as area, power dissipation and operating clock frequency. According to a method of this type, trial-and-error is inevitable before desired circuit performance is realized. That is to say, a combination of cells should be changed many times for that purpose. Also, to accurately estimate a characteristic value (e.g., wire capacitance) that is changeable depending on the layout adopted and will have a considerable effect on the resultant performance of an integrated circuit, the cell layout and replacement process is sometimes carried out repeatedly.

In any cell included in an integrated circuit being designed, the best specifications for realizing the desired performance are subject to change with various external conditions (e.g., load capacitance and drive) imposed on the cell. According to the known design process, however, an integrated circuit is designed using an existent cell library. Thus, not every cell in such a library is best suited for a given integrated circuit considering the external conditions thereof. In other words, it is not always possible to realize the best performance for each and every integrated circuit with a common library like this. Nevertheless, a design process should include a huge number of process steps if a broad variety of cells were prepared for a library while taking actual external conditions into account more fully.

SUMMARY OF THE INVENTION

It is therefore an object of the present invention to optimize the performance of an integrated circuit being designed much more efficiently.

Specifically, an inventive physical design method is applicable to an integrated circuit made up of multiple cells. The method includes the steps of: a) evaluating the overall performance of the integrated circuit; b) selecting, as a candidate cell that should have its performance changed, at least one of the cells from the integrated circuit based on a result of the step a); and c) changing the performance of the candidate cell selected in the step b). In the step c), a characteristic representing the performance of the candidate cell is determined in view of an external condition imposed on the candidate cell.

According to the present invention, a performance characteristic is determined for a cell, selected as a candidate cell, in view of an external condition imposed thereon. Thus, the performance characteristic of the cell can be estimated much more accurately. As a result, the overall performance of the integrated circuit being designed can be optimized.

In one embodiment of the present invention, the performance of the cell is preferably changed in the step c) by reference to a library, on which information about the respective cells is stored and on which two or more mutually different performance characteristics, associated with a single external condition, are stored for at least one of the cells. If two or more mutually different performance characteristics, associated with the external condition imposed on the candidate cell, are stored on the library, one of these performance characteristics is preferably selected.

In another embodiment of the present invention, the external condition imposed on the candidate cell preferably includes at least one of output load capacitance, input drive and input waveform. In still another embodiment, parameters representing the performance characteristic of the candidate cell preferably include at least one parameter selected from the group consisting of delay, area, power dissipation, output drive and input load capacitance.

Another inventive physical design method is also applicable to an integrated circuit made up of multiple cells. The method includes the steps of: a) evaluating the overall performance of the integrated circuit; b) selecting, as a candidate cell that should have its performance changed, at least one of the cells from the integrated circuit based on a result of the step a); and c) changing the performance of the candidate cell selected in the step b). The steps a), b) and c) are performed repeatedly. And in the step a), one of multiple evaluating approaches prepared is selected on a predetermined condition and the performances of the cells, included in the integrated circuit, are evaluated by the approach selected.

According to the present invention, the performances of cells, included in an integrated circuit, are evaluated by an approach selected from multiple approaches on a predetermined condition. Thus, the processing speed can be increased without decreasing the accuracy of cell performance estimation.

In one embodiment of the present invention, according to one of the approaches, the size of transistors, which make up each said cell, is preferably optimized with the area and performance of the cell taken into account. And then the performance of the cell, made up of the transistors of the optimized size, is evaluated.

In an alternative embodiment, according to another one of the approaches, the performance of at least one of the cells is preferably evaluated by reference to a library, on which information about the respective cells is stored and on which two or more mutually different performance characteristics are stored for the cell, and by interpolating and approximating the two or more performance characteristics.

In another embodiment, the predetermined condition may be presented considering at least priority levels of a specified length of a design process and target performance of the integrated circuit.

Alternatively, the predetermined condition may also be presented considering at least the number of times the steps a) through c) should be performed repeatedly.

In still another embodiment, the performance of each said cell may be evaluated in the step a) by reference to a library on which various performance characteristics, associated with respective external conditions, are stored for at least one of the cells. In that case, the predetermined condition is preferably presented considering at least difference between an external condition currently imposed on the cell and the external condition stored on the library for the same cell.

In yet another embodiment, the performance of each said cell may also be evaluated in the step a) by reference to a library on which size information is stored as one of the performance characteristic. In that case, the predetermined condition is preferably presented considering at least difference between information about the current size of the cell and the size information stored on the library for the same cell.

In yet another embodiment, the performance of each said cell may also be evaluated in the step a) by reference to a library on which the performance characteristics of the respective cells are stored. In that case, an alternative performance characteristic, which has been obtained for the cell as a result of the performance evaluation, is preferably newly registered with the library. In this manner, the performance characteristic of each cell can be more accurately estimated by reference to a library without increasing the number of process steps needed for building up a library.

Still another inventive physical design method is also applicable to an integrated circuit made up of multiple cells. The method includes the steps of: a) determining relative positions of the cells and wires interconnecting the cells together in the integrated circuit; b) evaluating a performance of the integrated circuit; c) selecting, as a candidate cell that should have its performance changed, at least one of the cells from the integrated circuit based on a result of the step b); and d) changing the performance of the candidate cell selected in the step c). The steps b), c) and d) are performed repeatedly. No matter how many times the steps b) through d) are performed, the same relative positions of the cells and wires, determined in the step a), are maintained.

According to the present invention, the same relative positions are maintained for cells and wires throughout the design process of an integrated circuit. Thus, the performance of an integrated circuit, which usually changes depending on the particular layout, can be estimated accurately, and an optimum solution can be obtained without getting stuck in a local solution or infinite loop.

In one embodiment of the present invention, the relative positions of the cells and wires may be determined in the step a) so that the area of the integrated circuit is minimized.

In another embodiment of the present invention, the relative positions of the cells and wires may be determined in the step a) so that the cells are placed at a uniform density in the integrated circuit.

In still another embodiment, the cells may be arranged in columns and rows in the step a). In the step b), the area of the integrated circuit may be estimated from a product of a maximum cell row length and a maximum cell column length.

In yet another embodiment, it may be estimated in the step b) how the shape of at least one of the wires changes when the area of the cell, having had its characteristic changed in the step d), changes. In that case, the performance of the integrated circuit is preferably evaluated while taking the estimated wire shape change into account.

Yet another inventive physical design method is also applicable to an integrated circuit made up of multiple cells. The method includes the steps of: a) evaluating the overall performance of the integrated circuit; b) selecting, as a candidate cell that should have its performance changed, at least one of the cells from the integrated circuit based on a result of the step a); and c) changing the performance of the candidate cell selected in the step b). The steps a), b) and c) are performed repeatedly. Each said cell should have a minimum area initially. And in the step c), the performance of the candidate cell is changed by allowing the candidate cell to just increase its area.

According to the present invention, each cell may have its performance changed so that its area just increases. That is to say, the performance of the cell can be estimated with its computational complexity reduced. As a result, the processing speed increases.

Yet another inventive physical design method is also applicable to an integrated circuit made up of multiple cells. The method includes the steps of: a) evaluating the overall performance of the integrated circuit; b) selecting, as a candidate cell that should have its performance changed, at least one of the cells from the integrated circuit based on a result of the step a); and c) changing the performance of the candidate cell selected in the step b). The steps a), b) and c) are performed repeatedly. And in the step a), the size of transistors, which make up each said cell, is optimized with the area and performance of the cell taken into account, and then the performance of the cell, made up of the transistors of the optimized size, is evaluated.

BRIEF DESCRIPTION OF THE DRAWINGS

FIGS. 3A and 3B illustrate an exemplary library for use in the illustrated embodiment of the present invention.

FIGS. 5A and 5B illustrate an example of a known library.

DESCRIPTION OF THE PREFERRED EMBODIMENTS

Hereinafter, preferred embodiments of the present invention will be described with reference to the accompanying drawings.

Figure 1:
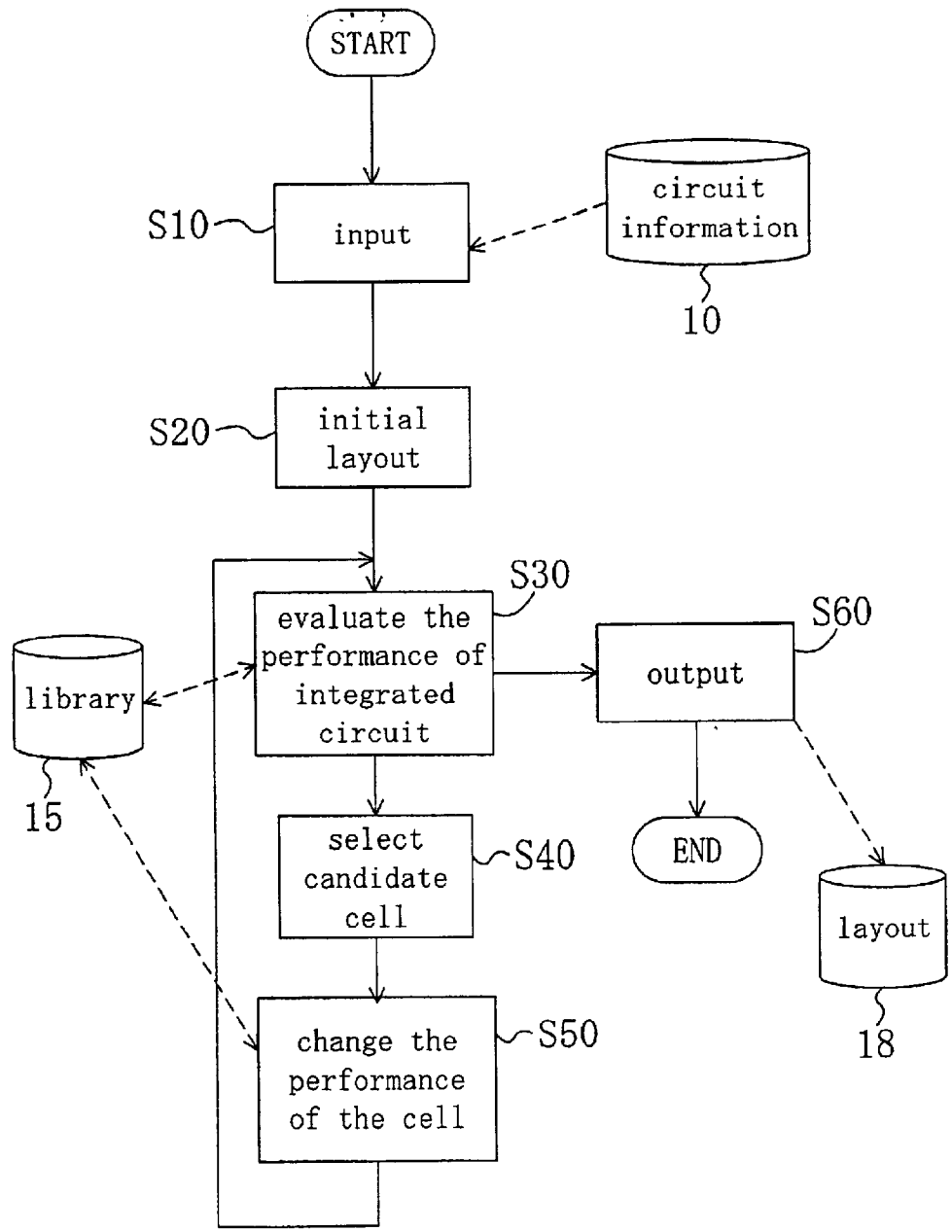
FIG. 1 is a flowchart illustrating a physical design process for an integrated circuit according to an embodiment of the present invention.

FIG. 1 is a flowchart illustrating a physical design process for an integrated circuit according to an embodiment of the present invention. In the embodiment illustrated in FIG. 1, first, information 10 about an integrated circuit to be designed is input in Step S10. Next, an initial layout is obtained for the circuit in Step S20. And then Steps S30, S40 and S50 are performed repeatedly by reference to a library 15 to optimize the performance of the circuit. And when a layout that would realize the desired performance is found, the layout result 18 is output in Step S60. For further details of Steps S30 and S40, it will be described later with reference to the flowchart illustrated in FIG. 2.

First, in Step S10, the information 10 about the integrated circuit under design is read. The circuit information 10 includes information about the logic functions of respective cells making up the circuit and information about the connectivity between the cells. If initial performance characteristics of the cells are included in the circuit information 10 read out, then the initial characteristics are used as they are. Otherwise, initial settings are determined so that each and every cell has a minimum possible size, for example.

Next, in Step S20, initial placement and initial routing are performed on the respective cells included in the circuit. The resultant placement/routing information will be used to accurately estimate the wire capacitance, wire resistance and so on that will affect the performance of the circuit seriously.

Specifically, in the course of optimization, the shape of each cell is changeable. Normally, the area is the major concern, so the layout should be changed every time any cell has changed its shape. In that case, however, it would take an enormous amount of computation time. In addition, the wire lengths would change discontinuously. Thus, the designer possibly gets stuck in local solutions or infinite loops during the optimization process. In view of these potential disadvantages, once the relative positions of the cells and wires, i.e., the horizontal and vertical positional relationship among the cells and wires, are determined for the initial layout, the same relative positions are maintained according to this embodiment until the design process is over. Instead, only the coordinates of each cell or wire are changed on the occasions of cell shape changes. The coordinates of a cell or wire may be changed by parallelly moving its surrounding cells and wires responsive to a cell shape change. In this manner, the computational speed can be increased, the layout information can be reflected on the performance optimization more accurately and the performance can be changed continuously.

Figure 2:
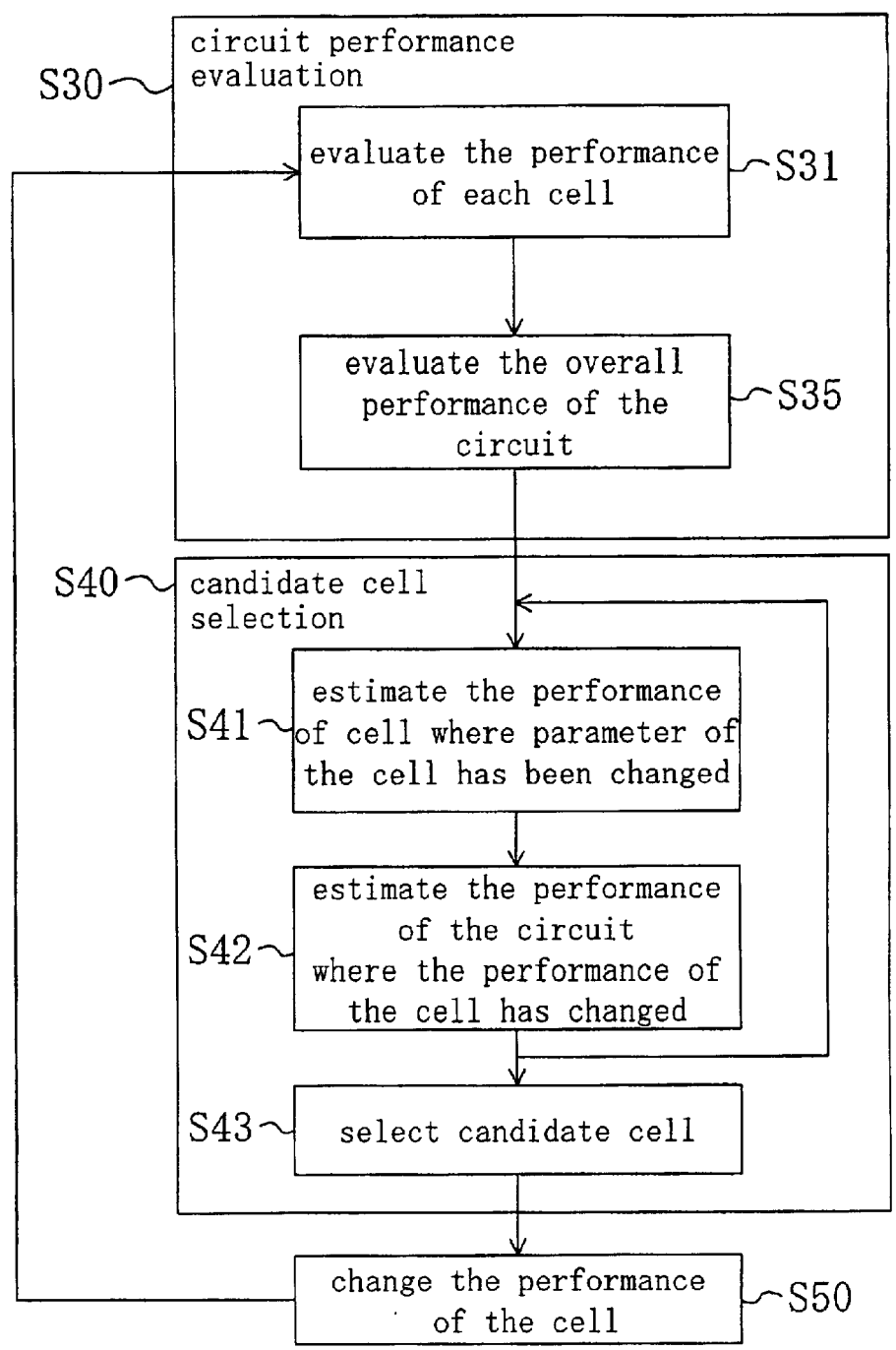
FIG. 2 is a flowchart illustrating, in further detail, Steps S30 through S50 of the process shown in FIG. 1.

Next, in Step S30, the performance characteristic of each cell included in the circuit is evaluated by reference to the library 15 (see Step S31 shown in FIG. 2). And by analyzing, in combination, the performance characteristics evaluated for all those cells, the overall performance of the circuit is evaluated (see Step S35 shown in FIG. 2). As used herein, the "performance characteristic" of each cell is represented by an arbitrary combination of various performance setting parameters like delay, area and power dissipation.

FIGS. 3A and 3B illustrate exemplary items of information stored on the library 15. Specifically, FIG. 3A illustrates a typical lineup of cells, while FIG. 3B illustrates detailed performance characteristic information on a library cell. As shown in FIG. 3A, only library cells representing different types of logic functions are registered with this library 15. On the other hand, as shown in FIG. 3B, various performance characteristics, optimized for a library cell for numerous pairs of external conditions, are stored on the library 15. Furthermore, even for the same pair of external conditions, multiple performance characteristics, which have been optimized using mutually different sets of design parameters, are stored.

That is to say, according to this embodiment, the library contains tradeoff information about the performance characteristics that were optimized under mutually different pairs of external conditions as shown in FIG. 3B. Accordingly, to realize desired performance (e.g., operating frequency) for an integrated circuit, one of a plurality of possible performance characteristics may be selected for each cell considering the pair of external conditions imposed on the cell. A method of preparing a number of performance characteristics for each cell with the external conditions imposed on the cell taken into account is disclosed in Japanese Laid-Open Publication No. 11-3973, for example. Alternatively, multiple performance characteristics may also be prepared by generating a number of representative cells exhibiting mutually different performance characteristics.

Figure 4A:
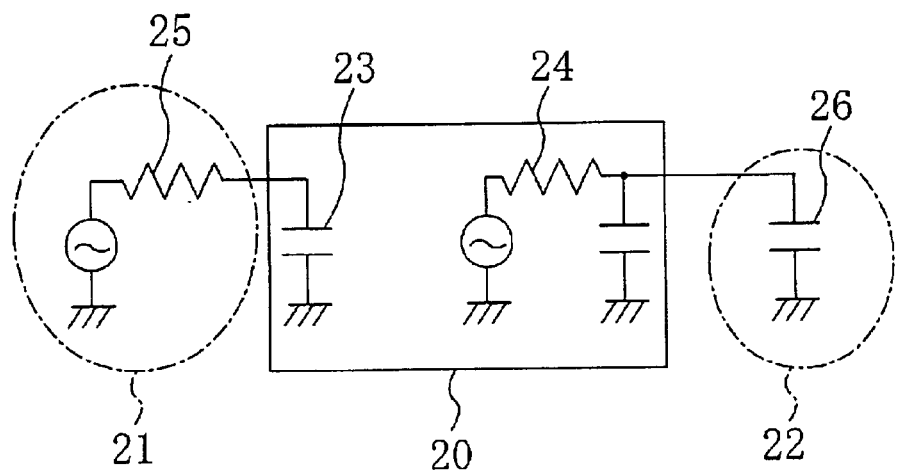
FIGS. 4A, 4B and 4C illustrate models for a library cell.
Figure 4B:
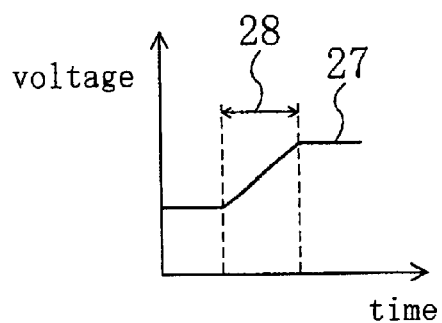
Figure 4C:
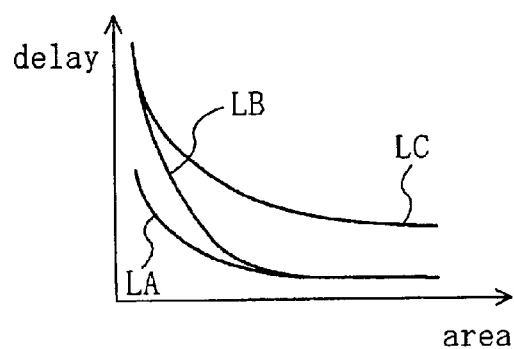

The performance characteristic of each cell may be represented by a combination of various performance-setting parameters like delay, area, power dissipation, output drive and input load capacitance. Examples of the external conditions imposed on the cell include output load capacitance, input drive and input waveform. FIGS. 4A, 4B and 4C illustrate respective models for a library cell. Specifically, FIG. 4A illustrates a circuit model for the cell, while FIG. 4B illustrates an input waveform model thereof. In FIG. 4A, input and output external condition models 21 and 22 are imposed on a cell model 20. Also, the performance characteristic of the cell 20 is determined not only by input load capacitance 23 and output drive 24 as exemplary performance setting parameters, but also by input drive 25 and output load capacitance 26 as exemplary external conditions. Alternatively, the input drive 25 may be replaced with an input waveform. As shown in FIG. 4B, the input waveform may be approximated by a curve 27 and may be represented by an interval 28 between a time the input voltage starts to change and a time the voltage ends the change.

Referring to FIG. 3B, if an optimum design should be obtained for a cell under the external conditions including an input drive of 10 kΩ and an output load capacitance of 0.1 pF, for example, then the cell exhibits any of multiple performance characteristics. One of those characteristics is represented by an area of 0.1 $\mu m^2$, a delay of 0.1 ns, a power dissipation of 10 $\mu$W, an output drive of 30 kΩ and an input load capacitance of 0.01 pF in combination. If the values of each performance setting parameter should be stored on the library in too small units, then the amount of data to be stored will be enormous. Accordingly, only typical combinations of parameter values should be stored on the library so that any other combination may be approximated using either a polygon or a spline function. Also, the input drive may be replaced with an input waveform.

FIG. 4C illustrates exemplary delay-area tradeoff curves for a library cell subjected to the optimization process under three sets of external conditions. In the example illustrated in FIG. 4C, the delay-area tradeoff curves LA, LB and LC are associated with three sets of external conditions A, B and C, respectively. That is to say, a performance characteristic, represented by a particular pair of delay and area on one of the rows shown in FIG. 3B, is associated with a point on any of the curves shown in FIG. 4C.

FIGS. 5A and 5B illustrate exemplary information stored on a known library. With the library shown in FIG. 5A, multiple library cells, exhibiting mutually different performance characteristics, are registered even for the same type of logic function. Accordingly, it takes a huge number of man-hours to design a library like this. Also, as shown in FIG. 5B, the known library is not designed with the difference in external condition taken into account, and the performance characteristic of a cell is supposed to be almost constant irrespective of the external conditions.

According to this embodiment, data about a number of cells, on which various sets of external conditions are respectively imposed or which exhibit mutually different performance characteristics, may be stored on the library 15 for the purpose of performance optimization. In that case, the performance characteristic of any cell can be estimated more accurately by reference to the library 15. Furthermore, every time a cell is newly generated in the design process of an integrated circuit, the cell may be registered with the library 15. Then, the performance characteristic of any cell can be estimated even more accurately by using the library 15.

As shown in FIG. 2, Step S30 includes Step S31 of evaluating the performance characteristic of each cell and Step S35 of evaluating the overall performance of the circuit. First, in Step S31, the library 15 shown in FIG. 3B is searched for a particular pair of external conditions (i.e., input drive and output load capacitance in this case) imposed on a given cell. In this manner, the cell's possible performance characteristics, represented by multiple combinations of parameters like delay, area, power dissipation, output drive and input load capacitance, are obtained. In this case, the input drive is the sum of the output drive of a preceding cell that drives the given cell and the resistance of a wire interconnecting these cells together. On the other hand, the output load capacitance is the sum of input capacitances of respective cells connected to an output terminal and wire capacitances extracted from the layout.

Then, in Step S35, the overall performance of the circuit is evaluated by analyzing the performance characteristics of the respective cells in combination. For example, a critical path delay is a maximum path delay that is calculated as a sum of delays caused by respective cells on a path. Also, the power to be dissipated by the circuit is calculated as a sum of power dissipation of all the cells. Furthermore, if the layout is changed when the area of a cell has changed, then the area of the circuit can be recalculated.

Next, in Step S40, at least one cell that should have its performance characteristic changed is selected. In the illustrated embodiment, a cell, which will have its performance characteristic improved most when one of the performance setting parameters is changed by the same small amount for each and every cell, is selected. For example, a cell, which will have its area minimized when the maximum delay is reduced by the same length for each cell, may be selected as the candidate cell. Alternatively, a cell that will have a minimum cost may also be selected as the candidate cell. The cost may be given by the following Equation (1):

$$\text{cost}=A\cdot\text{area}+B\cdot\text{maximum delay}+C\cdot\text{power dissipation} \quad (1)$$

where A, B and C are constants of proportionality.

Also, to estimate the delay and power dissipation more accurately in evaluating the performance characteristic of a cell, variations in wire capacitance and resistance are estimated. That is to say, if a cell has changed its shape, the wires and cells surrounding the cell are moved parallelly, thereby estimating how much the wire length will change. And using this variation in wire length, the variations in wire capacitance and resistance are calculated and reflected on the performance characteristic evaluated (e.g., delay and power dissipation).

Then, in Step S50, the performance characteristic of the cell that has been selected in Step S40 is changed. The characteristic of the cell may be changed by:
a) modifying at least one of the performance setting parameters, including area, delay, power dissipation, output drive and input load capacitance, stored on the library 15;
b) determining a transistor size by the method disclosed in Japanese Laid-Open Publication No. 11-3973 and estimating the values of cell performance setting parameters, including area, delay, power dissipation, output drive and input load capacitance, at the transistor size; or
c) determining a transistor size by the method disclosed in Japanese Laid-Open Publication No. 11-3973, automatically generating a cell layout by the method disclosed in Japanese Laid-Open Publication No. 9-298243 and estimating the values of the cell performance setting parameters, including area, delay, power dissipation, output drive and input load capacitance, using the layout created.

Of these three methods, the method (a) is most effective in computation speed, the method (c) is most accurate and the method (b) has accuracy somewhere between the methods (a) and (c). If the cell layout is generated in accordance with the method (c) every time an optimization process is performed, then it will take an enormous amount of computation time. However, if the cell synthesis is not performed at all during the optimization process but just once after the optimization process is finished, then the performance characteristic cannot be estimated accurately enough.

In this embodiment, to attain sufficient accuracy in a reasonable amount of processing time, it is automatically determined on a predetermined criterion whether or not the cell synthesis should be performed. Specifically, if an external condition imposed on the given cell is much different from the value registered with the library, then it is determined that a cell should be newly generated. On the other hand, if the external condition imposed on the given cell is not so much different from the value stored on the library but falls within an adequate range, then it is determined that the performance characteristic should be estimated without generating any cell. This decision may be made by the following Equation (2):

$$a/(1+k)<x<a\cdot(1+k) \quad (2)$$

where k (>0) is a precision parameter, a is a value that the current cell has for an external condition and x is a value registered with the library. If there is any cell, for which this Equation (2) is met for every external condition, in the library, then no cells should be generated.

Preferably, the area of each cell should be minimized initially and the performance characteristic of the selected cell should be changed in Step S50 so that the area of the cell just increases. This is because the processing time can be shortened in that case.

Also, information about the performance characteristics of the cells, generated this way during the optimization process, is preferably added as new items to the library 15.

Then, the performance characteristics stored on the library 15 can be more accurate.

These process steps S30, S40 and S50 are repeatedly performed until a layout realizing the desired performance for the integrated circuit is obtained, e.g., until the delay caused by the circuit becomes less than a constraint value. And when the ideal layout is found, Step S60 is performed. In Step S60, layouts for respective cells are automatically syn20 thesized so that the circuit realizes the target performance, and the layout result 18 for the circuit is output to end the design process.

In Step 530, one of multiple evaluating approaches prepared may be selected on a predetermined condition and the performance characteristics of the cells, included in the circuit, may be evaluated by the approach adopted.

Figure 6:
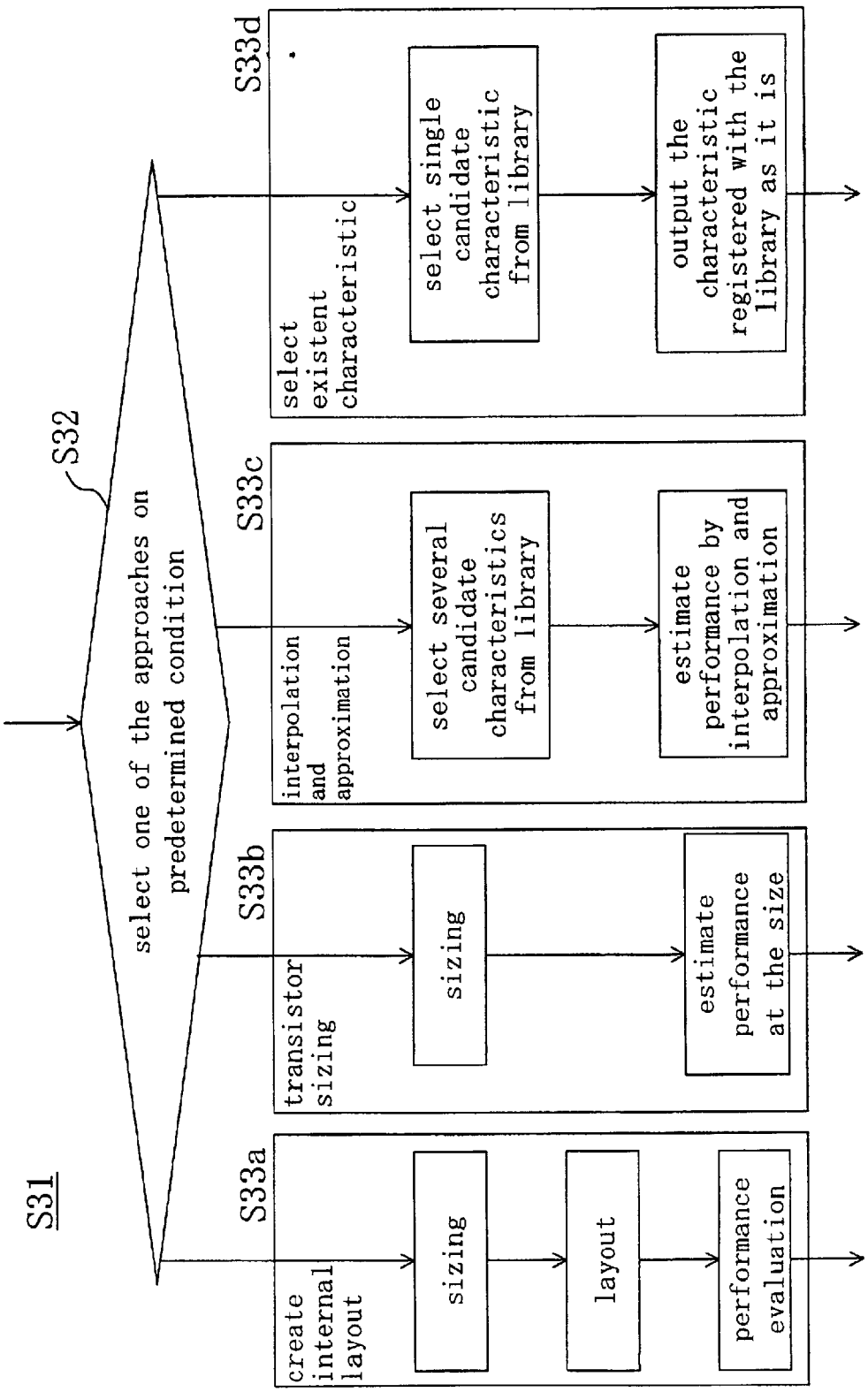
FIG. 6 is a flowchart illustrating the details of Step S31 of evaluating the performance characteristic of a cell included in Step S30 of evaluating the overall performance of an integrated circuit.

FIG. 6 is a flowchart illustrating the details of Step S31 of evaluating the performance characteristic of a cell included in Step S30. As shown in FIG. 6, four types of evaluating approaches S33a, S33b, S33c and S33d are prepared for Step S31. One of these approaches S33a through S33d is selected on a predetermined condition S32, thereby evaluating the performance characteristic of the cell in the circuit.

In the evaluating approach S33a, a transistor sizing process is performed, an internal layout is created for the cell and then the performance characteristic of the cell is evaluated. The transistor sizing process may be carried out by the method disclosed in Japanese Laid-Open Publication No. 11-3973, for example.

According to the evaluating approach 33b on the other hand, no internal layout is created for the cell, but just the transistor sizing process is performed and the performance characteristic of the cell is evaluated based on the result. In this case, the size of respective transistors is determined in such a manner as to obtain a cell with an arbitrary area and to realize the best performance characteristic for the cell. That is to say, in this evaluating approach, the size of respective transistors included in the cell is optimized with the area and performance of the cell taken into account, and the performance characteristic of the cell is evaluated at the transistor size optimized. This process is also realized by the method disclosed in Japanese Laid-Open Publication No. 11-3973. According to this method, the performance characteristic of a cell with an arbitrary area can be evaluated much faster than creating a layout. Also, since the size of respective transistors is determined by an external condition imposed on the cell when its performance characteristic should be evaluated, the characteristic of the cell can be estimated accurately enough. In addition, the performance characteristic of the cell can be improved. For example, if the same area is given, then the delay can be further shortened.

In the evaluating approach S33c, a performance characteristic registered with the library 15 is not used as it is. Instead, multiple performance characteristics, which are similar to each other in respect of size or external condition, are selected as candidates, and the performance characteristic of the cell is estimated by interpolating and approximating these candidate characteristics. Examples of the interpolation techniques include linear approximation, plane approximation and spline interpolation. In contrast, according to the evaluating approach S33d, one of the performance characteristics registered with the library 15 is used as it is.

Next, it will be described how one of the evaluating approaches is adopted in Step S32 on a predetermined condition. The condition is defined by the cost function cost given by the following Equation (3):

$$\text{cost} = C1 + N \cdot C2 + C3 \cdot I + C4 \cdot S \qquad (3)$$

And using three constants p1, p2 and p3 (where p1<p2<p3), one of the evaluating approaches is selected according to the following conditions:

a) If cost<p1, then the performance characteristic of the cell is evaluated by using one of the characteristics registered with the library 15 as it is (i.e., the approach S33d);

b) If p1<cost<p2, then the performance characteristic is evaluated by the interpolation and approximation techniques (i.e., the approach S33c);

c) If p2<cost<p3, then the performance characteristic is evaluated by the transistor sizing technique (i.e., the approach S33b); or d) If p3<cost, then the performance characteristic is evaluated by creating an internal layout for the cell (i.e., the approach S33a)

In Equation (3), C1 is a target design coefficient, which the designer can determine by considering which is the higher priority, the target performance of the integrated circuit being designed or the length of the development period. For example, where a high-performance circuit should be designed even if it takes a rather long time to develop it, then the coefficient C1 may be relatively large. Conversely, where the development period should be shortened even if the performance is sacrificed to a certain extent for that purpose (e.g., when there is not so much time left before the due date), then the coefficient C1 may be relatively small. That is to say, by including the coefficient C1 in the cost function cost, the best evaluating approach can be selected while considering the priority levels of, or striking an adequate balance between, the specified design period and target circuit performance.

Also, in Equation (3), C2 is a convergence coefficient and N is the number of times the set of process steps are repeated in the optimization process. That is to say, N has an initial value of zero and increases one by one every time the set of process steps are performed. Accordingly, the value of the cost function cost at a late stage of the optimization process is different from its value at an early stage, and the processing time can be shortened without sacrificing the performance so much. Specifically, at earlier stages of the optimization process, the solution is still far different from the optimum one, so the processing speed is a higher priority than the accuracy of the performance estimated. For that reason, the value of the cost function cost should be reduced so that the approach S33d or S33c is selected preferentially. On the other hand, as the solution of the optimization process converges on the optimum one, the value of the cost function cost should be increased so that the approach S33b or S33a is selected preferentially.

Moreover, in Equation (3), C3 is a coefficient representing the dependence on an external condition, and I is a variable that changes with the difference between the external condition (e.g., output load capacitance or input drive) currently imposed on the cell and the counterpart registered with the library 15. The estimation accuracy attainable by the approach S33d or S33c is sufficiently high while the current external condition is not so much different from that prepared for the library 15, but decreases as the difference increases. Accordingly, while the current external condition is not so different from the condition registered with the library 15, the coefficient I should be small. On the other hand, when there is already a big difference between those conditions, then the coefficient I should be increased so that the approach S33b or S33a is selected preferentially.

Furthermore, in Equation (3), C4 is a coefficient representing the dependence on cell change, and S is a variable that changes with the difference between the current size information (e.g., the area of the cell or the size of transistors) and the size information registered with the library 15. The estimation accuracy attainable by the approach S33d or S33c is sufficiently high while the current size information is not so much different from that prepared for the library 15, but decreases as the difference increases. Accordingly, while the current size information is still not so much different from the information registered with the library 15, the coefficient S should be small. On the other hand, if there is already a big difference between those conditions, then the coefficient S should be increased so that the approach S33b or S33a is selected preferentially.

It should be noted that these four terms for the cost function cost may be used either in combination or selectively depending on the necessity. Also, any other term not specified above may be used.

In the foregoing illustrative embodiment, one of multiple evaluating approaches is selected. Alternatively, the step of selecting one evaluating approach may be omitted so that one of these approaches, e.g., the approach S33b, is applied exclusively.

Figure 7A:
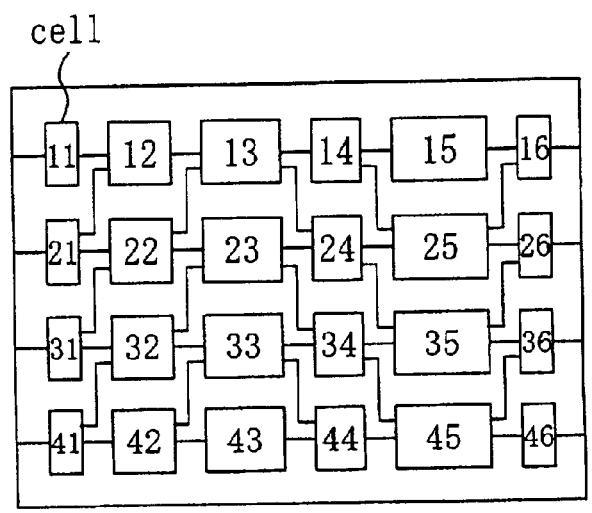
FIGS. 7A and 7B illustrate exemplary initial layouts.
Figure 7B:
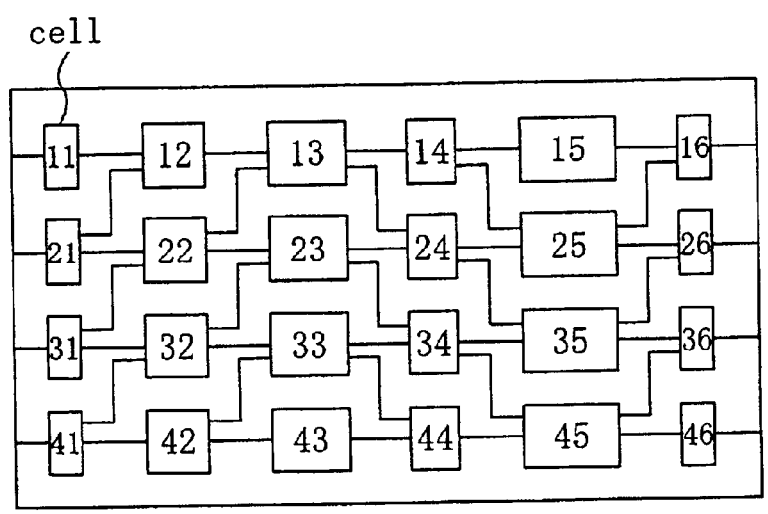

In the initial layout step S20, the relative positions of cells and wires may be determined in such a manner as to minimize the total area of the circuit as shown in FIG. 7A. Alternatively, the relative positions of cells and wires may also be determined in such a manner as to get the cells placed at a uniform density in the circuit as shown in FIG. 7B.

Also, if the cells are arranged in columns and rows in Step S20, then the area of the circuit may be estimated in Step S30 from the product of a maximum cell row length and a maximum cell column length. Naturally, though, it is possible to estimate the area of the circuit from the total area of the cells and wiring regions.

Figure 8A:
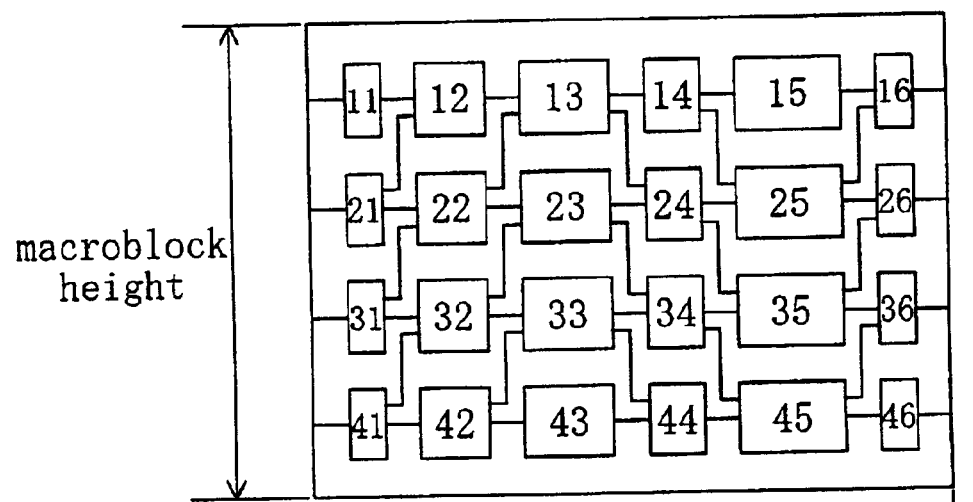
FIG. 8 illustrates how the performance of a circuit should be evaluated while taking a wire shape change into account.
Figure 8B:
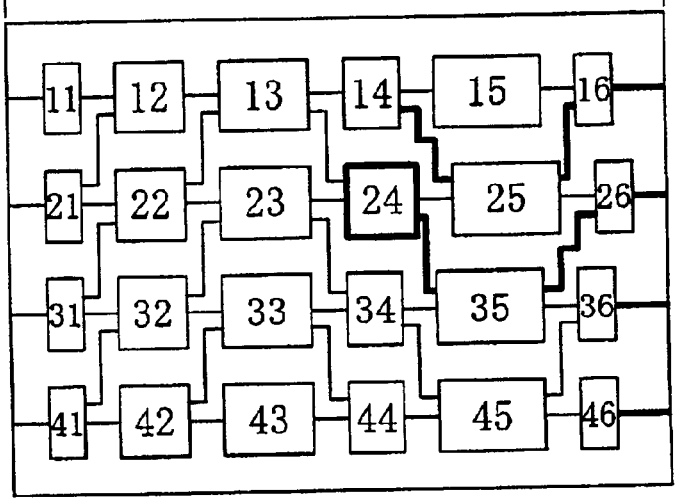

Furthermore, if the area of the cell has changed as a result of Step S50, then it should be estimated in Step S30 how the shapes of the wires will change due to the cell area change. And the performance of the circuit is preferably evaluated in view of the wire shape change estimated. For example, if a cell 24 has increased its area as a result of Step S50 as shown in FIG. 8, then the shapes of the bold wires change. Accordingly, the performance of the circuit should be evaluated with this wire shape change taken into account.

As described above, according to the present invention, the performance characteristic of each cell is estimated considering an external condition actually imposed on an integrated circuit. Thus, the performance of the circuit can be further improved. Also, since the performance characteristic of each cell is evaluated by an approach appropriately selected from multiple candidates, the processing speed can be increased without sacrificing the accuracy of cell performance estimation. Furthermore, once the relative positions of cells and wires are determined, those positions will be used throughout the design process of an integrated circuit. Accordingly, the performance of an integrated circuit, normally changing depending on the layout, can be estimated accurately. Moreover, the performance characteristics of cells are changed so that the areas of the cells just increase. Thus, the performance characteristics can be estimated at higher speeds with the computational complexity reduced.

What is claimed is:

1. A method of physical design for an integrated circuit made up of multiple cells, the method comprising the steps of:

a) evaluating the overall performance of the integrated circuit;

b) selecting, as a candidate cell that should have its performance changed, at least one of the cells from the integrated circuit based on a result of the step a); and c) changing the performance of the candidate cell selected in the step b), wherein in the step c), characteristic representing the performance of the candidate cell is determined in view of a specified external condition imposed on the candidate cell.

2. The method of claim 1, wherein in the step c), the performance of the cell is changed by reference to a library, on which information about the respective cells is stored and on which two or more mutually different performance characteristics, associated with a single external condition, are stored for at least one of the cells, and wherein if two or more mutually different performance characteristics, associated with the external condition imposed on the candidate cell, are stored on the library, one of these performance characteristics is selected.

3. The method of claim 1, wherein the external condition imposed on the candidate cell includes at least one of output load capacitance, input drive and input waveform.

4. The method of claim 1, wherein parameters representing the performance characteristic of the candidate cell include at least one parameter selected from the group consisting of delay, area, power dissipation, output drive and input load capacitance.

5. The method of claim 1, further comprising the step of:

a') determining relative positions of the cells and wires interconnecting the cells together in the integrated circuit, wherein the steps a), b) and c) are performed repeatedly, and wherein no matter how many times the steps a) through c) are performed, the same relative positions of the cells and wires, determined in the step a'), are maintained.

6. The method of claim 1, wherein the steps a), b) and c) are performed repeatedly, and wherein each aid cell should have a minimum area initially, and wherein in the step c), the performance of the candidate cell is changed by allowing the candidate cell to just increase its area.

7. A method of physical design for an integrated circuit made up of multiple cells, the method comprising the steps of:

preparing multiple evaluating approaches;

a) evaluating the overall performance of the integrated circuit;

b) selecting, as a candidate cell that should have its performance changed, at least one of the cells from the integrated circuit based on a result of the step a); and c) changing the performance of the candidate cell selected in the step b), wherein the steps a), b) and c) are performed repeatedly, and wherein in the step a), one of the multiple evaluating approaches prepared is selected on a predetermined condition and the performances of the cells, included in the integrated circuit, are evaluate by the approach selected.

8. The method of claim 7, wherein according to one of the approaches, the size of transistors, which make up each said cell, is optimized with the area and performance of the cell taken into account, and then the performance of the cell, made up of the transistors of the optimized size, is evaluated.

9. The method of claim 7, wherein according to one of the approaches, the performance of at least one of the cells is evaluated by reference to a library, on which information about the respective cells is stored and on which two or more mutually different performance characteristics are stored for the cell, and by interpolating and approximating the two or more performance characteristics.

10. The method of claim 7, wherein the predetermined condition is presented considering at least priority levels of a specified length of a design process and target performance of the intergrated circuit.

11. The method of claim 7, wherein the predetermined condition is presented considering at least the number of times the steps a) through c) should be performed repeatedly.

12. The method of claim 7, wherein in the step a), the performance of each said cell is evaluated by reference to a library on which various performance characteristics, associated with respective external conditions, are stored for at least one of the cells, and wherein the predetermined condition is presented considering at least difference between an external condition currently imposed on the cell and the external condition stored on the library for the same cell.

13. The method of claim 7, wherein in the step a), the performance of each said cell is evaluated by reference to a library on which size information is stored as one of the performance characteristic, and wherein the predetermined condition is presented considering at least difference between information about the current size of the cell and the size information stored on the library for the same cell.

14. The method of claim 7, wherein in the step a), the performance of each said cell is evaluated by reference to a library on which the performance characteristics of the respective cells are stored, and wherein an alternative performance characteristic, which has been obtained for the cell as a result of the performance evaluation, is newly registered with the library.

15. The method of claim 7, further comprising the step of:

a') determining relative positions of the cells and wires interconnecting the cells together in the integrated circuit, wherein no matter how many times the steps a) through c) are performed, the same relative positions of the cells and wires, determined in the step a'), are maintained.

16. The method of claim 7, wherein each said cell should have a minimum area initially, and wherein in the step c), the performance of the candidate cell is changed by allowing the candidate cell to just increase its area.

17. A method of physical design for an integrated circuit made up of multiple cells, each cell includes a plurality of elements and performs a logic function, the method comprising the steps of:

a) determining relative positions of the cells and wires interconnecting the cells together in the integrated circuit;
   b) evaluating a performance of the integrated circuit;
   c) selecting, as a candidate cell that should have its performance changed, at least one of the cells from the integrated circuit based on a result of the step b); and
   d) changing the performance of the candidate cell selected in the step c),
   wherein the steps b), c) and d) are performed repeatedly, and wherein no matter how many times the steps b) through d) are performed, the same relative positions of the cells and wires, determined in the step a) are maintained, and
   wherein in the step a), the relative positions of the cells and wires are determined so that the area of the integrated circuit is minimized.

18. A method of physical design for an integrated circuit made up of multiple cells, each cell includes a plurality of elements and performs a logic function, the method comprising the steps of:

a) determining relative positions of the cells and wires interconnecting the cells together in the integrated circuit;
   b) evaluating a performance of the integrated circuit;
   c) selecting, as a candidate cell that should have its performance changed, at least one of the cells from the integrated circuit based on a result of the step b); and
   d) changing the performance of the candidate cell selected in the step c),
   wherein the steps b), c) and d) are performed repeatedly, and wherein no matter how many times the steps b) through d) are performed, the same relative positions of the cells and wires, determined in the step a), are maintained, and
   wherein in the step a), the relative positions of the cells and wires are determined so that the cells are placed at a uniform density in the integrated circuit.

19. A method of physical design for an integrated circuit made up of multiple cells, each cell includes a plurality of elements and performs a logic function, the method comprising the steps of:

a) determining relative positions of the cells and wires interconnecting the cells together in the integrated circuit;
   b) evaluating a performance of the integrated circuit;
   c) selecting, as a candidate cell that should have its performance changed, at least one of the cells from the integrated circuit based on a result of the step b); and
   d) changing the performance of the candidate cell selected in the step c),
   wherein the steps b), c) and d) are performed repeatedly, and wherein no matter how many times the steps b) through d) are performed, the same relative positions of the cells and wires, determined in the step a), are maintained, and
   wherein in the step a), the cells are arranged in columns and rows, and wherein in the step b), the area of the integrated circuit is estimated from a product of a maximum cell row length and a maxim cell column length.

20. A method of physical design for an integrated circuit made up of multiple cells, each cell includes a plurality of elements and performs a logic function, the method comprising the steps of:

a) determining relative positions of the cells and wires interconnecting the cells together in the integrated circuit;
   b) evaluating a performance of the integrated circuit;
   c) selecting, as a candidate cell that should have its performance changed, at least one of the cells from the integrated circuit based on a result of the step a); and
   d) changing the performance of the candidate cell selected in the step c),
   wherein the steps b), c) and d) are performed repeatedly, and wherein no matter how many times the steps b) through d) are performed, the same relative positions of the cells and wires, determined in the step a), are maintained, and
   wherein in the step b), it is estimated how the shape of at least one of the wires changes when the area of the cell, having had its characteristic changed in the step d), changes, and the performance of the integrated circuit is evaluated while taking the estimated wire shape change into account.

21. A method of physical design for an integrated circuit made up of multiple cells, the method comprising the steps of:

a) evaluating the overall performance of the integrated circuit;
   b) selecting, as a candidate cell that should have its performance changed, at least one of the cells from the integrated circuit based on a result of the step a); and
   c) changing the performance of the candidate cell selected in the step b),
   wherein the steps a), b) and c) are performed repeatedly, and
   wherein in the step a), the size of transistors, which make up each said cell, is optimized with the area and performance of the cell taken into account, and then the performance of the cell, made up of the transistors of the optimized size, is evaluated.

22. The method of claim 21, further comprising the step of:

a') determining relative positions of the cells and wires interconnecting the cells together in the integrated circuit,
   wherein no matter how many times the steps a) through c) are performed, the same relative positions of the cells and wires, determined in the step a'), are maintained.

23. The method of claim 21, wherein each said cell should have a minimum area initially, and wherein in the step c), the performance of the candidate cell is changed by allowing the candidate cell to just increase its area.

* * * * *